United States Patent [19]
Arsenov et al.

[11] Patent Number: 5,936,878
[45] Date of Patent: Aug. 10, 1999

[54] POLYMERIC PHOTO-CHROMIC COMPOSITION

[75] Inventors: Vladimir Arsenov, Dolgoprudny, Russian Federation; Jacob N. Malkin, Ashdod, Israel

[73] Assignee: OMD Devices LLC, Wilmington, Del.

[21] Appl. No.: 08/989,460

[22] Filed: Dec. 12, 1997

Related U.S. Application Data

[60] Provisional application No. 60/034,544, Jan. 6, 1997.

[51] Int. Cl.$^6$ .............................. G11C 13/04; G11C 7/00
[52] U.S. Cl. ........................... 365/111; 305/215; 305/106
[58] Field of Search ................................... 365/111, 215, 365/106, 234

[56] References Cited

U.S. PATENT DOCUMENTS

| | | |
|---|---|---|
| 4,026,869 | 5/1977 | Evens et al. . |
| 4,036,805 | 7/1977 | Tsujimoto et al. . |
| 4,288,861 | 9/1981 | Swainson et al. ...................... 365/127 |
| 4,864,536 | 9/1989 | Lindmayer . |
| 5,019,476 | 5/1991 | Kanno et al. .............................. 430/20 |
| 5,113,387 | 5/1992 | Goldsmith et al. . |
| 5,177,227 | 1/1993 | Fischer et al. . |
| 5,208,354 | 5/1993 | Fischer et al. . |
| 5,268,862 | 12/1993 | Rentzepis . |
| 5,289,407 | 2/1994 | Strickler et al. ......................... 365/106 |
| 5,325,324 | 6/1994 | Rentzepis et al. . |
| 5,407,885 | 4/1995 | Fischer et al. . |
| 5,738,960 | 4/1998 | Abe .......................................... 430/21 |

OTHER PUBLICATIONS

Parthenopoulos, Dimitri A. et al., "Three–Dimensional . . . Memory," Sci., vol. 245, 843–845 (1989).

Malkin, J. et al., "Photochromism . . . Naphthacenequinones," J. Am. Chem. Soc., 1994, 116, 1101–1105 (1994).

Sokolyuk, N.T. et al., "Naphthacenequinones: Synthesis and Properties," Russian Chem. Review 61(11), 1005–1024 (1993).

Gritsan, N.P. et al., "Kinetic Study of . . . 1–alkyl–9, 10–anthra–quinones," Russian J. of Phys. Chem. 64(11), 1660–1663 (1990).

Gritsan, N.P. et al., "Mechanism of Photochromic . . . Derivatives," J. Photochemistry and Photobiology, A: Chemistry, 52 (1990) 137–156.

Gritsan, Nina P. et al., "Experimental and Theoretrical . . . 1–Methylanthraquinone," J. Am. Chem. Soc. 1991, 113, 9615–9620.

Irie, Masahiro et al., "Thermally Irreversible . . . Derivatives," J. Org. Chem., vol. 53, No. 4, 1988, 803–808.

Nakamura, Shinichiro et al., "Thermally Irreversible . . . Study," J. Org. Chem. 1988, 53, 6136–6138.

Irie, M., "Design and Synthesis of Photochromic Memory Media," 1994.

*Primary Examiner*—Huan Hoang
*Attorney, Agent, or Firm*—Blank Rome Comisky & Mccauley LLP

[57] ABSTRACT

The present invention relates to the field of photo-chromic materials, in particular, to photo-chromic compounds and matrices suitable for use in optical memory systems, including three dimensional optical memory systems for computers, multimedia applications and the like. In particular, nonfluorescent spiropyrane is transformed into fluorescent merocyanine by electromagnetic radiation.

7 Claims, 4 Drawing Sheets

POLYMERIC PHOTO-CHROMIC COMPOSITION

This a Continuation-in-Part of Provisional application Ser. No. 60/034,544, filed on Jan. 6, 1997, the subject matter of which is incorporated herein by reference in its entirety.

FIELD OF THE INVENTION

The present invention relates to the field of photo-chromic materials, in particular, to photo-chromic compounds and matrices suitable for use in optical memory systems, including three dimensional optical memory systems for computers, multimedia applications and the like.

BACKGROUND OF THE INVENTION

The need for improved memory devices, memory media and memory processing for computers has been dramatically demonstrated by the increasing speed and computational power of modern computer with vastly more complex programs to access and store in memory.

The major factor which is determinant of the size and price of a computer is the memory.

The data storage requirements of new performance computers and multimedia applications of computers is very large, typically many giga-bytes ($10^{12}$ bits) and even tera-bytes. New and improved, compact, low cost, very high capacity memory devices are required. These memory devices should be able to store many giga-bytes of information, and should randomly retrieve such information at very fast random access speeds demanded by practical applications of modern computing and data processing.

An optical memory offers the possibility of packing binary-stated information into a storage medium at very high density, each binary bit occupying a space only about one wavelength in diameter. When practical information are taken into account this leads to a total capacity of about $10^{11}$ bits for a reasonably-sized two-dimensional optical storage medium.

At the present two general classes of optical recording medium exist, namely phase recording medium and amplitude recording medium. The first is based on light-induced changes of the index of refraction (i.e., phase holograms) whereas the second refers to photo-induced changes in the absorption coefficient (i.e., hole burning) or two photon absorption processes.

Various optical memory devices have been proposed, including 3D optical memory described by Rentzepis in U.S. Pat. No. 5,268,862, and Rentzepis and Esener in U.S. Pat. No. 5,325,324, herein incorporated by reference, a three dimensional laser disc drive system described by Goldsmith et al. in U.S. Pat. No. 5,113,387, herein incorporated by reference, optical memory system and method described by Lindmayer in U.S. Pat. No. 4,864,536, herein incorporated by reference and optical system, based on photo-chromic substances described by Malkin in USA Patent Application U.S. Ser. No. 08/577707, herein incorporated by reference. Another three-dimensional optical storage memory system is described by Parthinopoulos et al. in Science, Vol. 245. Pages 843–845, August 1989, also incorporated herein by reference.

Generally, a photochromic material in all these devices changes color when irradiated with UV, visible or infrared radiation while in the ground state. The light is adsorbed by the ground state molecule, which then undergoes a photochemical reaction to form the photoinduced state. Preferable, the photoinduced state absorbs light at a different wavelength than the ground state of a molecule. The photoinduced state reverts to the ground state by thermal reversion or by being irradiated with light again, preferably light with a different wavelength than the light used to "read" the photoinduced state.

The photochromic material is incorporated within a 3D matrix that is transparent to the activating light. The material then is irradiated, preferable by a laser, at point within the matrix to photochemically change the light absorption of the photochromic material at a site within the matrix. The 3D memory device "reads" the information by irradiating the sites with light at a wavelength for which the photoinduced state has a high absorption and high fluorescence yield. The information associated with a location can be erased by irradiation thereof with light having wavelength causing reverse photochemical change the photoinduced state B back to the ground state A.

The problem of practical implementation of a concept of creating three-dimensional optical memory based on the above phenomenon of photo-chromism of organic compounds with fluorescent detection faces difficulty in choosing a suitable active media.

The active media should combine a multitude of physical-chemical properties simultaneously. Among these properties we can distinguish the most evident and simple ones 1) Molecules of the active media shall be adequate photochromic i.e. absorption bands of form A and form B shall have bigger extinction coefficients and shall not overlap.
2) Molecules B shall possess photochemical and thermal stability.
3) Quantum yields of direct (A to B, $\psi_B$) and back (B to A, $\psi_A$) photoreaction shall be sufficiently high and ($\psi_B >> \psi_A$).
4) Form B of photochromic substance should fluoresce (fluorescence is the most sensitive spectral method allowing to detect minimum number of molecules).
5) It is desirable that the quantum yield of this fluorescence should be as high as possible substantially exceeding the quantum yield of the reverse photoreaction. Evidently it is a problem to combine simultaneously all desirable properties in one chemical material.

A variety of photo-chromic materials have been suggested for use as the active element in optical memory systems, J. Malkin et al. In *Photochemistry of Molecular Systems for Optical 3D Storage Memory, Research on Chemical Intermediates*, Vol. 19, No. 2, pages 159–189 (1993) (herein incorporated by references) suggests the use of spiropyrans as photochromic materials in 3D memory devices. Fisher et al. In U.S. Pat. Nos. 5,208,354; 5,177,2278 and 5,407,885, herein incorporated by references, describe the synthesis and the use of naphthacenequinones for the reversible optical storage of information.

The synthesis and use of naphthacenequinones as fluorescent dyes was described in U.S. Pat. No. 4,036,805 herein incorporated by references; the kinetics of photo-chromic effect were described by Malkin et al. In *Photochromism and Kinetics of Naphthacenequinones, Journal of the American Chemical Society*, Vol. 116, pages 1104–1109 (1994), herein incorporated by references. The synthesis and properties of naphthacenequinones were reviewed by N. T. Sokoluk et al. In an article, *Naphthacenequinones: Synthesis and Properties, Russian Chemical Reviews*, vol. 62, pages 1085–1024 (1993) herein incorporated by references.

The photo-chromic properties of anthraquinones have also been studied in the following articles by N. P. Gritsan et al.: *Kinetic Study of the Photochromic Transformations of 1-alkyl-9, 10-anthraquinones, Russian Journal of Physical Chemistry*, Vol. 64, 3081–3086 (1990), *Experimental and Theoretical Studies of Photoenolization Mechanisms for 1-Methylanthraquinone, Journal of the American Chemical Society*, Vol. 113, pages 9915–9920 (1991), *and Mechanism of Photochromic Transformations of Peri-acyloxy-9,10- and 1,9-Anthraquinone Derivatives, Journal of Photochemistry and Photobiology*, Vol. 52A, pages 137–151 (1990); all the above herein incorporated by references.

The application of diarylethene-type systems with heterocyclic rings was described in Jap. Patent 89,954. The synthesis and properties of diarylethenes was reviewed by M. Irie et al.: *Thermally Irreversible Photochromic Systems, Journal of Organic Chemistry*, Vol. 53, pages 6136–6138 (1988) and *Journal of Organic Chemistry*, Vol. 53, pages 803–808 (1988) and *Design and Synthesis of Photochromic Memory Media in Photoreactive Materials for Ultrahigh Density Optical Memory*; M. Irie (Ed.); Elsevier, 1994, pages 1–34.

The main problem associated with the use of the proposed spiropyrans as photo-chromic substrates in an optical memory devices is lies in the fact that their photo-induced form is not thermally stable and is capable to revert to the ground state by itself To prevent the undesirable spontaneous reversion to the ground state, the matrix carrying these photo-chromic materials must be cooled to at least −78° C. and preferably lower temperatures. Necessity in such low temperatures as a precondition for efficient functioning of devices utilizing above materials is associated with difficulties in design and limits the scope of possible applications. Besides that spiropyrans usually lose their photochromic properties after a few read-write-erase cycles.

The main unsolved problem with the use all the known organic substances (including spiropyrans) in 3D memory devices based on fluorescence registration is the non-destructive reading. The readout stability of all known photo-chromic medium materials is not sufficient. This means, that even illumination with weak light used for reading can induce the erasing reaction, which is proportional to the numbers of photons absorbed by the media. Therefore after many readout cycles the memory is destroyed.

SUMMARY OF THE INVENTION

The main object of the present invention is to provide a new and improved photo-chromic materials having physical and photo-chemical properties for use of these materials in available 3D memory storage devices based on luminescent reading.

Another object of the present invention is to provide a new and improved photo-chromic materials defined by high recording capacity and which are stable in use and reuse (read-write-erase cycles) and in which the reading of the information based on fluorescence is not accompanied by erasing this information.

Another object of the present invention is to provide new and improved medium having increased sensitivity to illumination by light at room temperature.

In accordance with the present invention the medium material having the above improved properties comprises a light sensitive photo-chromic polymeric composition based polyesters of 2,2'-bis-(4-oxyphenylpropane), pimelinc acid and α, α'-bis(6nitro-8-oxymethyl-3',3-dientylspiro(2H-1benzopyran-2,2-indoline)-1-il)-p-xylene.

In one of the preferred embodiments the above composition comprises additive of an IR-absorber, which is known as a component of photochromic materials used in manufacturing of microfilms and reprography.

It should be pointed out that above polyesters per se have been described by Evens and Smetz in U.S. Pat. No. 4,026,869 as suitable for an imaging process. Nevertheless neither luminescent properties of this composition nor its suitability for use in optical memory systems employing photo-induced luminescence for recording and reading of information were proposed or even hinted in the above patent.

Therefore in accordance with the present invention it was unexpectedly revealed that above polyesters can undergo photo-chromic reaction accompanied with luminescence appearance which makes them suitable for the purposes of a 3D optical memory system and that the medium material based on these polyesters has improved performances in comparison with the known in the art compositions.

DETAILED DESCRIPTION OF THE PREFERRED EMBODIMENTS

Figure 1:
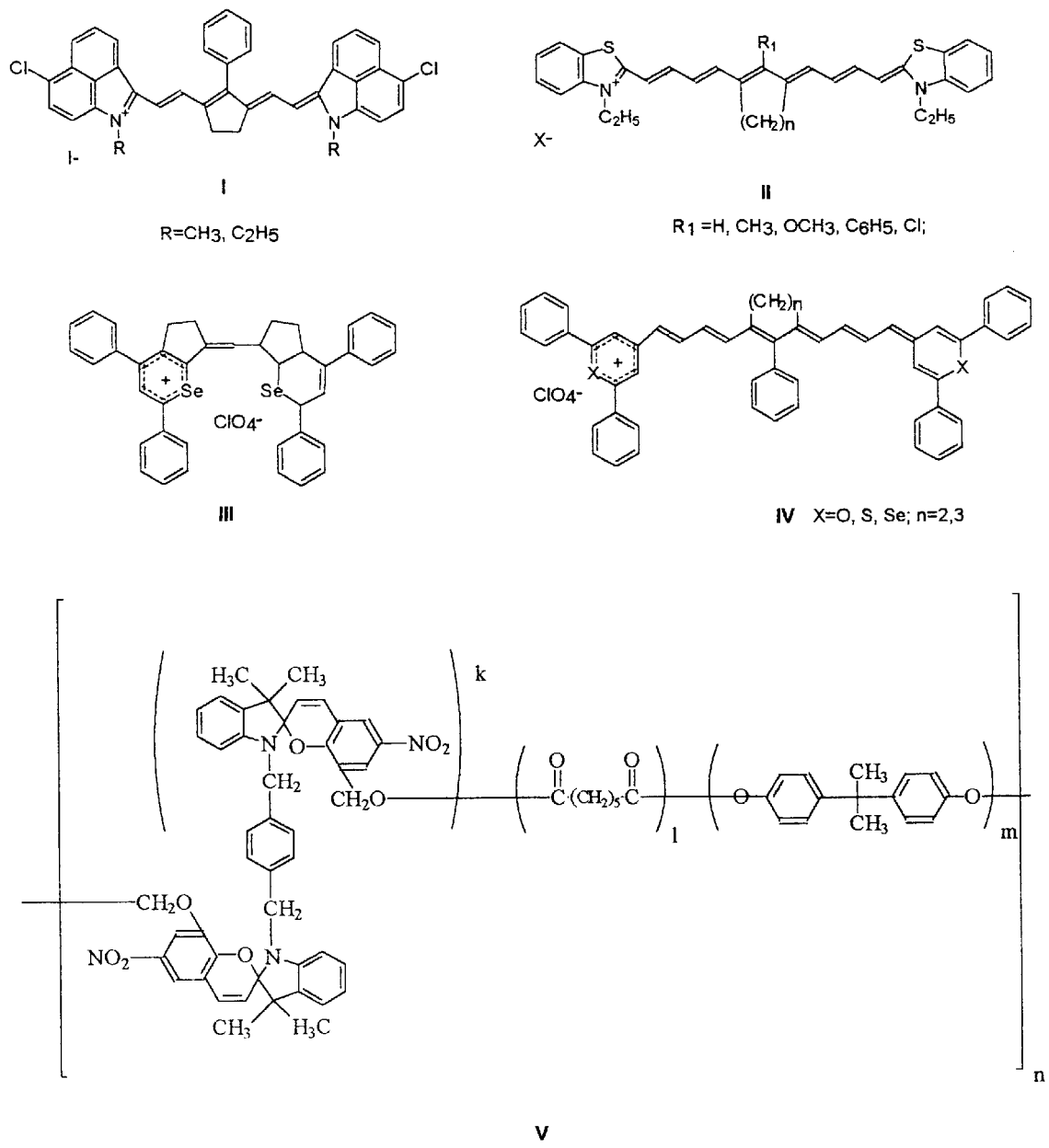
FIG. 1 shows structural chemical formulae of polyesters found as suitable for use in optical memory systems in accordance with the present invention and of various absorbers suitable for use in combination with these polyesters.

In accordance with the present invention polyesters of 2,2'-bis-(4-oxyphenylpropane), pimelinic acid and prepared by addition of 0.48 g (0.6mmol) of α, α'-bis(6-nitro-8-oxymethyl-3',3-dimethylspiro(2H-1-benzopyran-2,2-indoline)-1-il)-p-xylene of the formula V were synthesized according to a following procedure.

To a solution of 2.26 g (10 mmol) of 2,2'-bis-(4-oxyphenylpropane), 0.8 g (20 mmol) of NaOH and 25 ml of water 0.12 g of methyltriphenylphosphonium bromide in 10 ml of methylene chloride are added with stirring. To a mixture thus obtained a solution prepared by addition of 0.48 g (0.6 mmol) of α, α'-bis-(6-nitro-8-oxymethyl-3',3-dimethylspiro(2H-1-benzopyran-2,2-indoline)-1-il)-p-xylene, 3.6 ml (12 mmol) of triethylamine in 10 ml of dry methylene chloride to 2.1 g (10.6 mmol) of dichloroanhydride of pimelinic acid is added during 10 minutes with stirring. The reaction mixture is stirred for 15 minutes, the water layer is separated. The organic layer is washed with water (3×15 ml) and the polyester is precipitated with 190 ml of ethanol. Re-precipitation of polyester in the methylene chloride-ethanol (1:7) system is repeated twice. Yield of polyester V(a) is 1.7 g.

Following the procedure presented above from 10 mmol of 2,2'-bis-(4-oxyphenylpropane), 1.6 mmol α, α'-bis(6-nitro-8-oxymethyl-3',3-dimethylspiro(2H-1-benzopyran-2, 2-indoline)-1-il-p-xylene 11.6 mmol of dichloroanhydride of pimelinic acid or 10 mmol 2',2-bis-(4-oxyphenylpropane), 4.1 mmol α,α'-bis-(6-nitro-8-oxymethyl-3',3-dimethylspiro(2H-1-benzopyran-2,2-indoline)-1-il)-p-xylene 14.1 mmol of dichloroanhydride of pimelinic acid and given in the procedure amounts of other reagents accordingly 2.0 g of polyester V(b) and 1.1 g of polyester IIV(c) are obtained. As a result of the presence in the polymer of aliphatic chains, the mobility of the chain elements is greatly enhanced and the glass transition temperature of that photochromic polymer is much lower than for other polymers (in some combination even as low as 50° C.)

Content of the links, molecular mass ($M_n$), temperature of vitrification ($T_c$) of polyesters V(a),V(b),V9(c) is presented in non limiting Table 1 below.

TABLE 1

| Polyester | Content of links, % mol. | | | $M_n \times 10^3$ | $T_g$, °C. |
| --- | --- | --- | --- | --- | --- |
| | k | l | m | | |
| V(a) | 2.8 | 50 | 47.2 | 16 | 55 |
| V(b) | 6.9 | 50 | 43.1 | 8.3 | 72 |
| V(c) | 14.5 | 50 | 35.5 | 3.8 | 80 |

Now with reference to non limiting examples 1–12 and FIGS. 2–3 it will be explained how an active medium comprising the above polymers can be prepared and used for recording and reading of information in 3D optical memory devices.

EXAMPE 1

Figure 4:
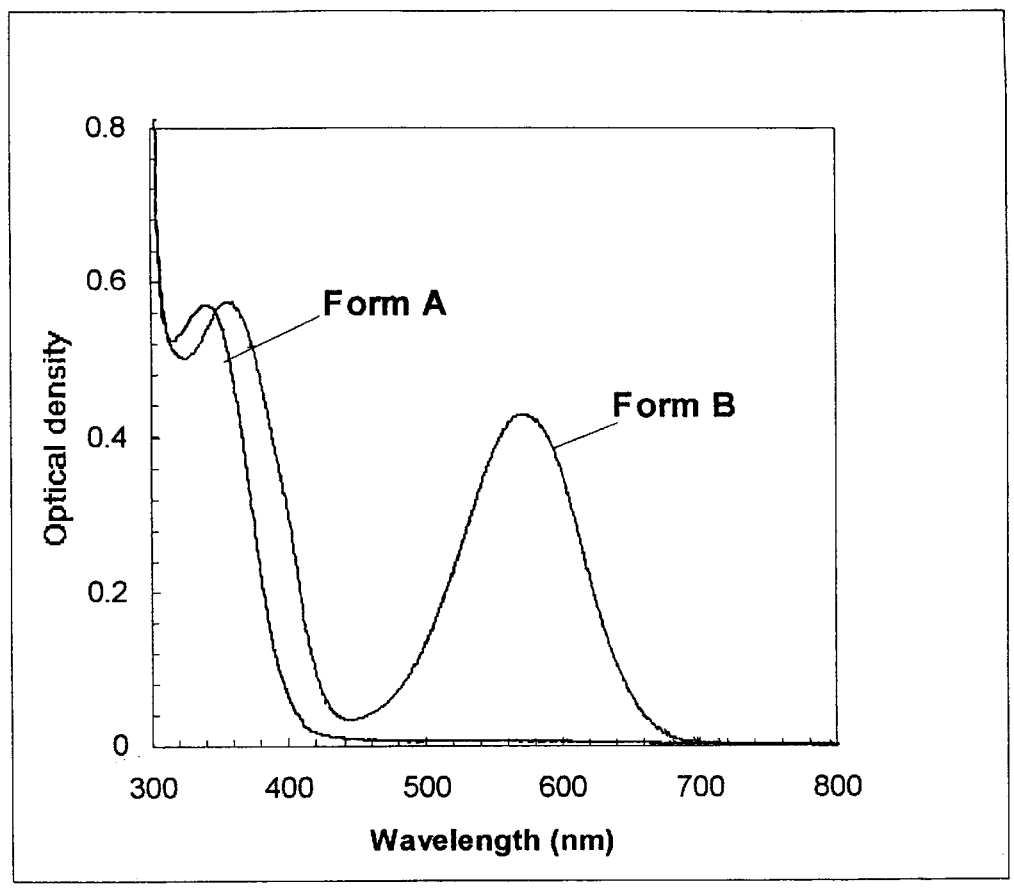
FIG. 4 shows UV-visible spectra of an active medium material in accordance with the present invention before and after exposure to UV light irradiation.

1 g of polyester having formula V(a) is dissolved in 10 ml of methylene chloride. A light sensitive layer of photo-chromic medium material of 15 μ thickness is prepared from the thus obtained solution by method of irrigation of a glass slide with subsequent drying on air. A sample layer was irradiated at the room temperature with a UV light produced by high pressure Hg-lamp (DRK-120) from the distance of 120 cm. Measurements of the optical density were made in the points of maximum of the photo-induced absorption band and during the time, when the optical density have reached half of its maximum value proportional to the relative quantum yield of the photo-coloration $\psi_{re1}$, thus characterizing the sensitivity of photo-chromic material to light irradiation. The absorbance spectra of the prepared material (in arbitrary units) before and after irradiation are shown in FIG. 4 and values of ($\psi_{re1}$ are presented in non limiting Table 2.

The obtained layer in the starting condition is lightly colored (light-cherry color) and it has been found that exposing of selected locations of this dried photo-chromic layer at a room temperature (and at temperature lower than glass transition temperature) is associated with changing of color of these locations. This photo-coloration is stable at the temperature lower than glass transition temperature (there is no thermo-chromism at that temperature). This means that the photo-induced color did no longer fade away when exposed to visible light and did no longer fade away in the dark. Thus the recorded information (photo-induced color) can be read for thousands times without any erasure. The photo-chemical reaction enabling recording of information in the polyesters having general formula V can be written as follows:

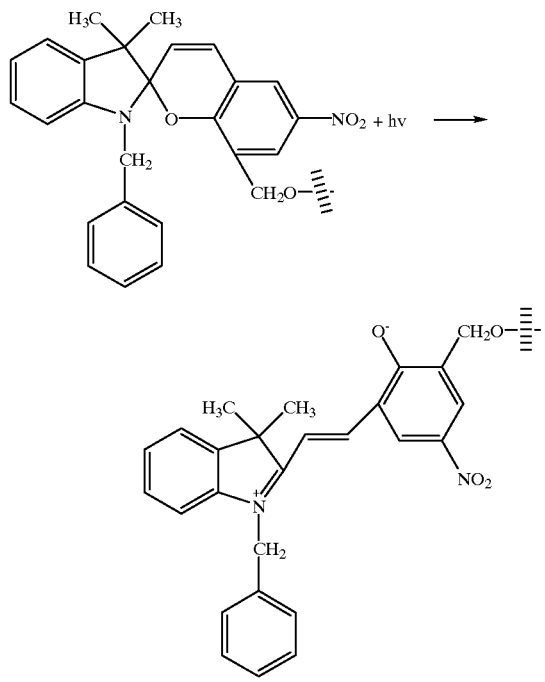

In order to make changes in the recorded information it is projected onto a large mat screen, for example coated with paraffin. New information is added on the screen with a pointed object, for example by a needle, or old information is erased. In places where the corrections were made the screen becomes transparent to the light. Irradiating with light through the screen facilitates the recording of new additional information on the photo-chromic material. Such a procedure is undertaken at the room temperature, because when the photo-chromic material is heated the main information can be erased too.

The complete erasure of the information is effected in the dark by keeping the present material for 30–40 minutes at the temperature which are 15–20° C. higher than $T_g$ of polyesters and further by cooling to the room temperature.

In the conditions of a dark room the storage time of information recorded on active medium comprising polyesters prepared in accordance with the above procedure is in excess of one year. Loss of photo-induced optical density after one year storage is 33–67% for active medium comprising the known in the art polyesters and 28–61% for active medium comprising polyesters in accordance with the present invention (compare U.S. Pat. No. 4,026,869).

The number of the "record-erase" cycles is 18–21 both for the known in the art polyesters and polyesters in accordance with the present invention..

The resolution value of the medium material in accordance with the present invention is 700–800 lines/mm, which is comparable with the resolution value 650–850 lines/mm of the known in the art polyesters.

It has been empirically revealed that the sensitivity of the recording (sensitivity to light) can be improved if the medium material in addition to the polymer contains additive of 0.2–3% mass. of an IR-absorber of the formula I or II or III or IV shown in FIG. 1 As such absorber it can be advantageous to use tricarbocyanine dyes of formula I, undecamethynecyanines of formula IV, selenopyrylocyanine III and pyryloundecamethynecyanines of the formula IV. All above compounds are very well known and quite available in photographic industry and quantum electronics (see for example Tolmachev, A. I.; Uspechi Nauchnoj Fotografii, 1984, vol. 22, p. 12 (in Russian.).

In the following non limiting examples 2–12 and tables 2, 3 it will be shown how sensitivity of an active medium is increased if the composition of the medium material comprises the above absorbers.

EXAMPLE 2

1 g of polyester having formula V(a) and 0.002 g (0.2% mass.) of an IR-absorber are dissolved in 10 ml of methylene chloride. The obtained solution is applied to the glass slide, dried on air and thus a light sensitive layer having thickness of 15 $\mu$ is obtained. The sample of the layer in the initial condition is lightly colored (light-cherry color), the UV irradiation causes a color change (to lilac-colored). The value of $\psi_{re1}$ of the layer, obtained according to the procedure described in Example 1 is shown in Table 2.

EXAMPLES 3–9

According to the procedures described in examples 1, 2 the layers with thickness of 15 $\mu$ were prepared from polyesters having formulae V(b) and V(c) and from compositions which in addition to polyesters V(a), V(b) and V(c) also contained an IR-absorber. The layers in the initial condition were slightly colored (light-cherry color), the UV irradiation causes change of the color to intense lilac color. The composition and $\psi_{re1}$ value of the layers, prepared according to the procedure described in Example 1 are shown in Table 2.

EXAMPLES 10–12

According to procedures explained in examples 1, 2 the layers having thickness 15 $\mu$ were prepared from the composition comprising polyester of formula V(a) with addition of an IR absorber of formula II ($R_1$,=Ph, n=2, X=ClO$_4$) or an IR-absorber of formula III or an IR-absorber of formula IV (n-2, X=O). The sample of the layer in the initial condition is slightly colored (light cherry color), the UV irradiation causes change of color to lilac. The composition and $\psi_{re1}$ value of the layers, prepared according to the procedure described in Example 1 are shown in the Table 3.

From the data presented in Table 2 follows that at the room temperature the light sensitivity does not depend on the polyester type, but depends on the type of an IR-absorber added to this polyester. It can be seen that addition of an IR-absorber increases the sensitivity to light of polyesters up to 8 times. It can be appreciated that by virtue of this provision one can change the recorded information without additional heating and therefore faster.

As it was shown above the claimed composition in contrast to the known in the art polyesters allows to make highly effective recording and correcting of the information at the room temperature without reducing the storage time of the information, number of "record-erase" cycles and of resolution.

In practice the amount of the absorber to be added to the photo-chromic composition is 0.2–3.0 % mass. Addition of less than 0.2% mass. of the absorber results in only a slight increase in the sensitivity to light of the photo-chromic material. Addition of more than 3.0% mass. of the polyester does not lead to a further increase in the sensitivity to light.

TABLE 2

| Example | Composition of the material | % mass. | $\phi_{rel}$, min. |
|---|---|---|---|
| 1 | V(a) | 100 | 4.0 |
| 2 | V(a) + IR-absorber I | 99.8 + 0.2 | 3.5 |
| 3 | V(b) + IR-absorber I | 99 + 1 | 1.0 |
| 4 | V(a) + IR-absorber I | 97 + 3 | 0.5 |
| 5 | V(b) | 100 | 4.1 |
| 6 | V(b) + IR-absorber I | 99 + 1 | 1.3 |
| 7 | V(b) + IR-absorber I | 97 + 3 | 0.55 |
| 8 | V(c) | 100 | 4.0 |
| 9 | V(c) + IR-absorber I | 97 + 3 | 0.45 |

TABLE 3

| Example | Composition of the material | % mass. | $\phi_{rel}$, min. |
|---|---|---|---|
| 1 | V(a) + IR-absorber II | 97 + 3 | 0.55 |
| 2 | V(a) + IR-absorber III | 97 + 3 | 0.60 |
| 3 | V(a) + IR-absorber IV | 97 + 3 | 0.50 |

Now with reference to FIGS. 2, 3 it will be explained how recording and reading of information within the working medium in accordance with the present invention is carried out.

Figure 2:
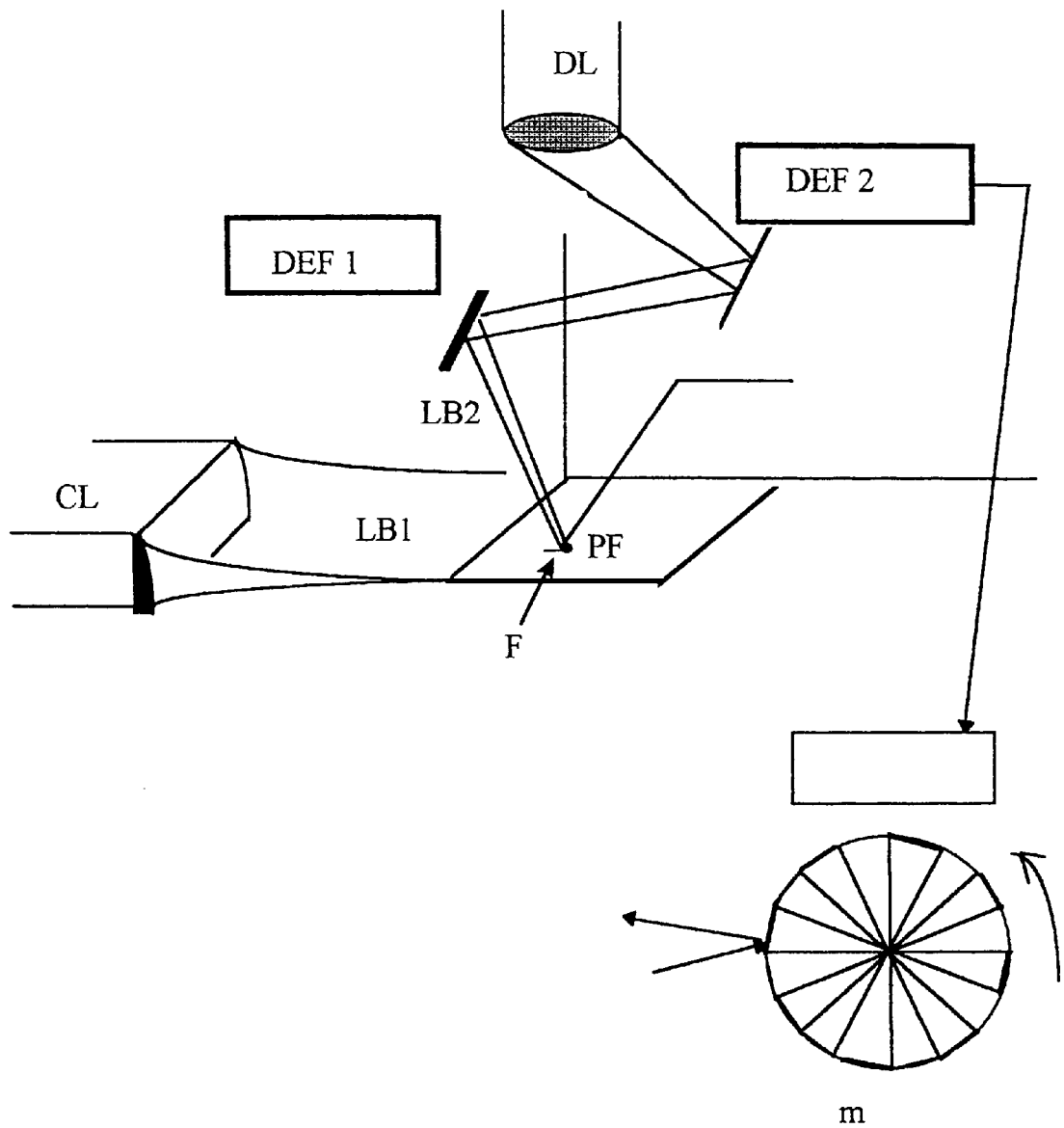
FIGS. 2, 3 show various setups suitable for recording and reading of information in the optical memory system employing active medium in accordance with the present invention.

As can be seen in FIG. 2 two laser beams LB1 and LB2 from two respective laser sources (not shown) are selectively directed onto the layer of polymeric film F constituting a matrix carrying an active medium therein. The composition of this medium is chosen in accordance with the present invention. The first beam is produced by a cylindrical lens CL and the second beam is produced by a diode laser DL and then the beams are deflected by virtue of deflectors Def1 and Def2. The film is transparent to the electromagnetic radiation at least in some parts of the spectrum.

Recording of information was implemented by two beams with wave length of 532 nm and 1064 nm. The beam at 532 nm wave length is focused by the cylindrical lens creating flat beam LB1 with uniform thickness of app. 30$\mu$. The intersection of this beam with focused beam LF2 irradiated at 1064 nm wave length is accompanied by the corresponding photo-chemical reaction in selected location of the photo-chromic polyester film. In practice this location looks like a colored point.

Scanning of the beam having wave length of 1064 nm in a XY-plane can be effected either by scanning/rotating mirror device M, or by two acoustic-optical crystals (not shown) capable to deflect the beam in orthogonal coordinates system.

The probability or the cross-section of two-photon absorption is W(2$\omega$)~$I_1I_2$, i.e. is proportional to the product of intensities of two beams. Thus one can decrease the intensity of one beam on the account of intensity of the other beam and thus to keep the probability value invariant. According to available theoretical and experimental data the intensity level is over $10^8$–$10^9$ W/cm$^2$ which is for sufficient for two-photon absorption process.

Figure 3:
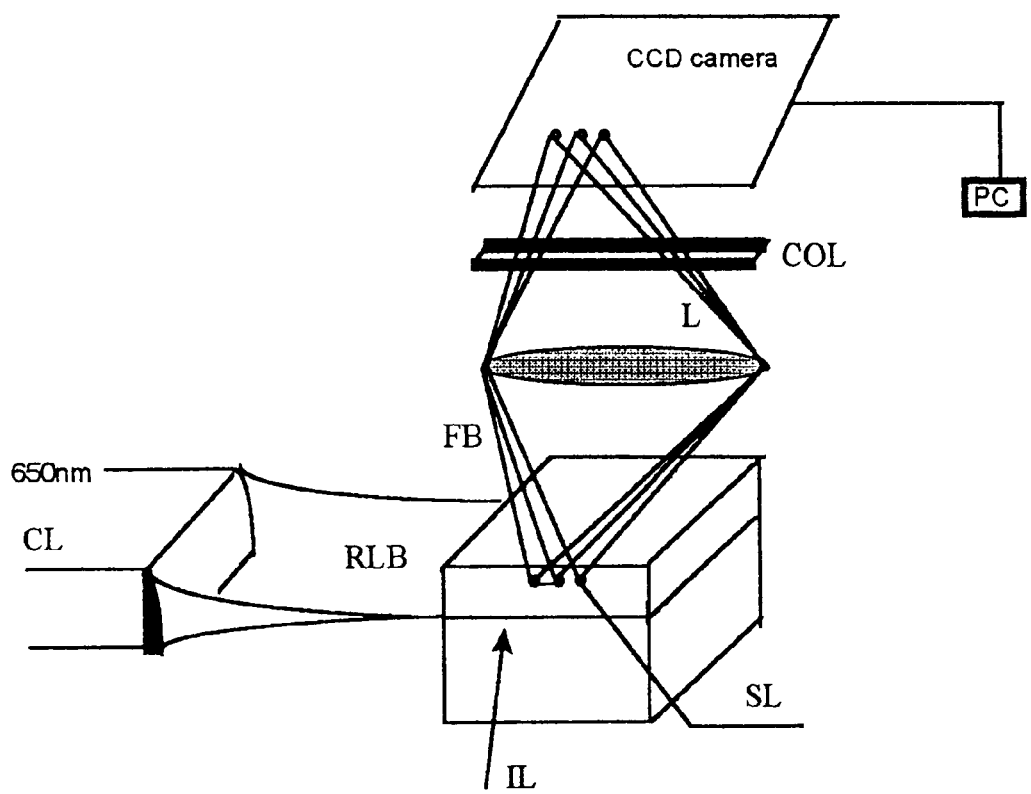

Reading the information stored in selected locations within a certain layer of a matrix with active medium can be carried out by a set-up presented in FIG. 3. The layer IL within the matrix MAT is illuminated by a flat shaped uniformly focused reading laser beam RLB produced by the cylindrical lens CL. The properly chosen wavelength of the reading beam should induce the one photon excitation in those selected locations SL of the layer which were previously illuminated by laser beams LB1, LB2. The fluorescent beams FB excited from the selected locations are focused by a lens L, collimated by a collimator COL and then sensed by a high resolution CCD camera. The points on the layer where the information has been stored (the points where photo-induced merocyanine form of photo-chromic spiropyran is formed) would be a source of fluorescence and will be seen on the CCD camera screen, while the points without stored information would be black on the CCD camera screen. Thus, each selected location on the layer can be imaged as the corresponding pixel on the CCD. It might be useful to use a moving slit having opening enabling access to information associated with locations residing along a line. This measure can improve the optical image quality and also the resolution and the signal-to-noise ratio.

It can be readily appreciated that reading of the information recorded in accordance with the present invention can be easily carried out by a well developed, computerized, fast and commercially available CCD device.

In conclusion it should be pointed out that recording and reading of information based on photo-chromic polycondensates of the polyester type of the present invention has the following advantages:

1. For recording of information it is sufficient to use only very low power, even a CW light sources.
2. For recording of information there is no need actually in the monochromatic light source, thus the diode laser array or bar can be successfully utilized.
3. The layer within the film can be illuminated from all four sides thereof, thus allowing to reach the required pump beam power density.
4. For reading of recorded information it is sufficient to use the well developed and available methods and equipment.

It should be understood that the present invention should not be limited to the above described examples and embodiments.

Changes and modifications can be made by one ordinarily skilled in the art without deviation from the scope of the invention.

The scope of the present invention is defined in the appended claims. However it should be understood that the features disclosed in the foregoing description, in the following claims and/or accompanying examples and/or tables and/or figures may separately and in any combination thereof be material for realizing the present invention in diverse forms thereof.

We claim:

1. A method of recording of information within a 3-D memory system comprising a matrix carrying an active photo-chromic medium material, said method comprising illuminating of said matrix by a first electromagnetic radiation so as to induce within said medium material a photo-chemical reaction being associated with recording of said information, wherein during said reaction a first form A of said medium material, which is not fluorescent upon illuminating thereof by said first radiation is transformed into a second form B of said medium material, which is fluorescent upon illuminating thereof by a second electromagnetic radiation, said first and said second electromagnetic radiation having different wavelengths characterized in that said photo-chemical reaction is transformation of a non fluorescent spiropyrane into fluorescent merocyanine form thereof according to the following equation:

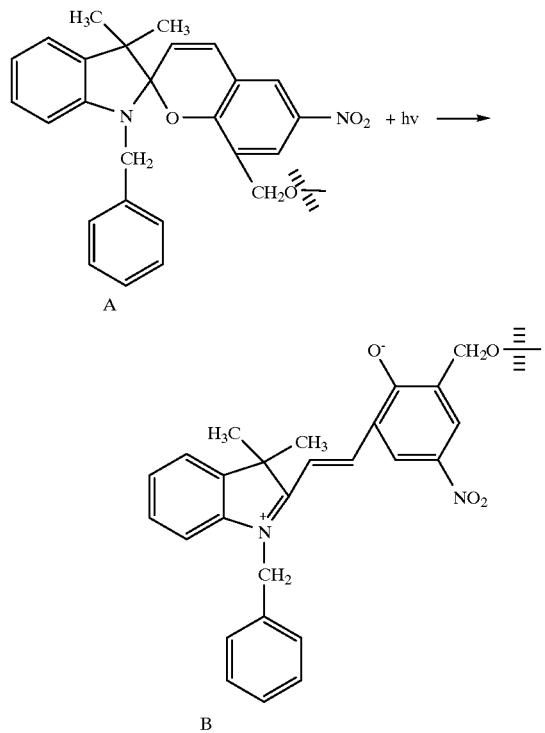

2. The method of recording as defined in claim 1, characterized in that said first electromagnetic radiation is carried out either in the one or two photon mode and it is effected preferably by a diode laser.

3. The method of recording as defined in claim 1, characterized in that said medium material comprises at least one polyester of 2,2'-bis-(4-oxyphenylpropane), pimelinic acid and α, α'-bis-(6-nitro-8-oxymethyl-3',3-dimethylspiro (2H-1-benzopyran-2,2-indoline)-1-il)-p-xylene of the general formula V below

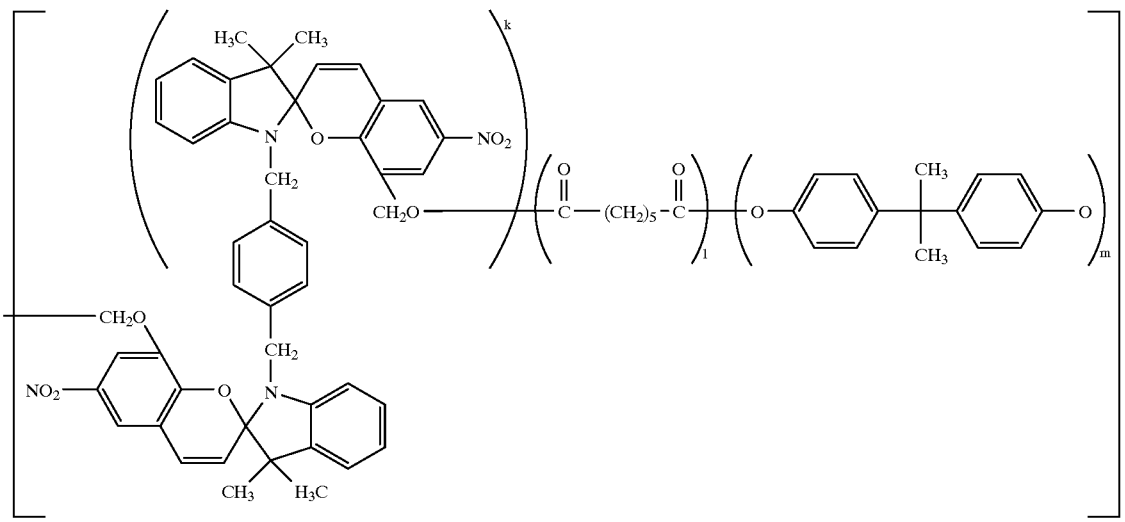
where k=2–20, 1=50, m=30–50.
4. The method as defined in claim 1 characterized in that said active medium comprises an additive capable to increase the sensitivity of said polyester to said first radiation and said additive comprises at least one compound chosen from the group of compounds having formula I–IV below
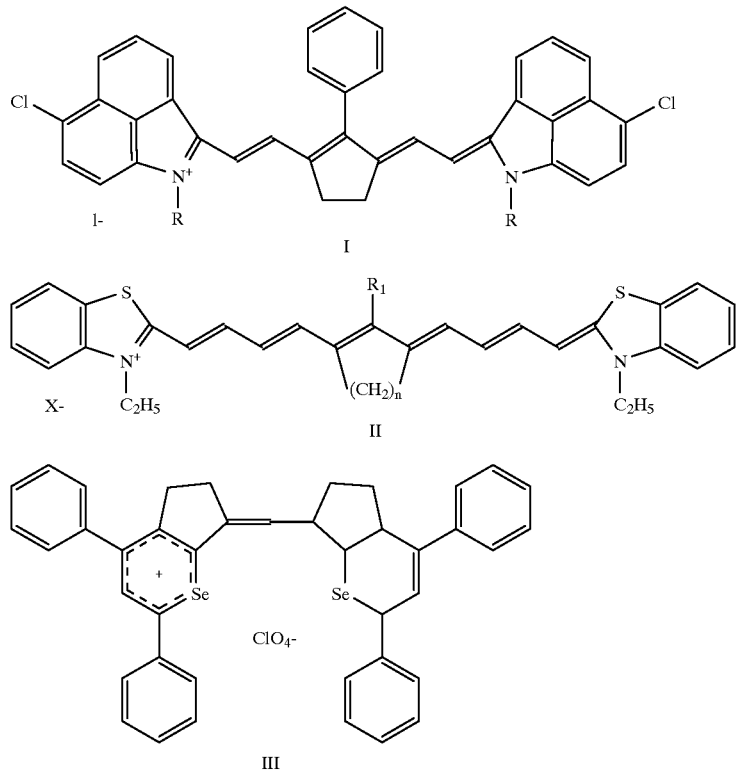

-continued

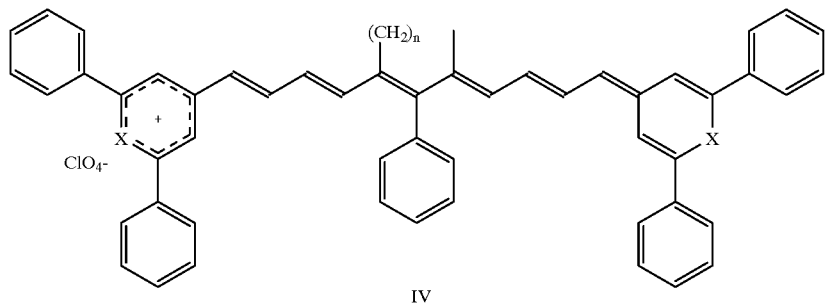

IV

I., where R=CH$_3$, C$_2$H$_5$, II., where R$_1$=H, CH$_3$, OCH$_3$, C$_6$H$_5$, Cl; X=Cl, CN; IV., where X=O, S, Se;, n=2, 3.

5. The method of recording as defined in claim 4, characterized in that said medium material comprises 97.0–99.8% mass. of said polyester and 3.0–0.2% mass. of said additive.

6. A 3D memory system, comprising an active medium material capable to exist in a first non-fluorescent form A thereof, said first form being photo-chemically convertible into a second form B thereof, said second form exhibiting induced fluorescence upon irradiating thereof by electromagnetic radiation, characterized in that said medium material comprises at least one polyester of 2,2'-bis-(4-oxyphenylpropane), pimelinic acid and α, α'-bis-(6-nitro-8-oxymethyl-3', 3-dimethylspiro(2H-1-benzopyran-2,2-indoline)-1-il)-p-xylene having general formula V below.

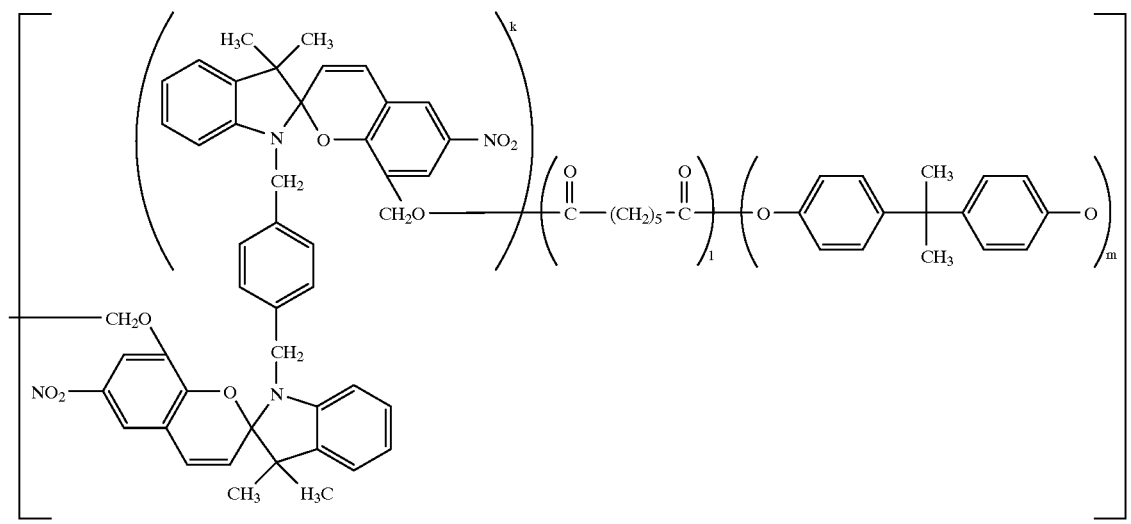

7. The 3D memory system as defined in claim 6, characterized in that said active medium material comprises an additive capable to increase the sensitivity of said polyester to said electromagnetic radiation and said additive comprises at least one compound chosen from the group consisting essential of compounds of formula I, II, III or IV.

* * * * *